United States Patent
Yoon et al.

(10) Patent No.: US 7,541,206 B2
(45) Date of Patent: Jun. 2, 2009

(54) NITRIDE-BASED SEMICONDUCTOR LIGHT-EMITTING DEVICE AND METHOD OF MANUFACTURING THE SAME

(75) Inventors: Suk-ho Yoon, Seoul (KR); Cheol-soo Sone, Anyang-si (KR); Jeong-wook Lee, Seongnam-si (KR); Joo-sung Kim, Yongin-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 215 days.

(21) Appl. No.: 11/649,237

(22) Filed: Jan. 4, 2007

(65) Prior Publication Data
US 2007/0202624 A1    Aug. 30, 2007

(30) Foreign Application Priority Data
Feb. 24, 2006    (KR)    ............ 10-2006-0018445

(51) Int. Cl.
*H01L 21/00*    (2006.01)
*H01L 29/06*    (2006.01)

(52) U.S. Cl. ............ 438/29; 438/39; 438/46; 257/13; 257/94

(58) Field of Classification Search ............ 438/29, 438/32, 39, 42, 46, 47; 257/12, 13, 94, 95, 257/98
See application file for complete search history.

(56) References Cited

U.S. PATENT DOCUMENTS

| | | | |
|---|---|---|---|
| 6,171,956 B1 * | 1/2001 | Lou | 438/665 |
| 6,441,403 B1 * | 8/2002 | Chang et al. | 257/94 |
| 6,514,674 B1 * | 2/2003 | Iwasaki | 430/321 |
| 7,075,115 B2 | 7/2006 | Sacamoto et al. | |
| 7,187,007 B2 * | 3/2007 | Kim et al. | 257/79 |
| 7,294,866 B2 * | 11/2007 | Liu | 257/100 |
| 2002/0195609 A1 * | 12/2002 | Yoshitake et al. | 257/81 |

(Continued)

FOREIGN PATENT DOCUMENTS

JP    2002-016312    1/2002

(Continued)

OTHER PUBLICATIONS

*Office Action issued in Korean Intellectual Property Office on Oct. 27, 2008.

*Primary Examiner*—Kevin M Picardat
(74) *Attorney, Agent, or Firm*—Buchanan Ingersoll & Rooney PC

(57) ABSTRACT

A nitride-based semiconductor light-emitting device having an improved structure to enhance light extraction efficiency, and a method of manufacturing the same are provided. The method includes the operations of sequentially forming an n-clad layer, an active layer, and a p-clad layer on a substrate; forming a plurality of masking dots on an upper surface of the p-clad layer; forming a p-contact layer having a rough surface on portions of the p-clad layer between the masking dots; forming a rough n-contact surface of the n-clad layer having the same rough shape as the rough shape of the p-contact layer by dry-etching from a portion of the upper surface of the p-contact layer to a desired depth of the n-clad layer; forming an n-electrode on the rough n-contact surface; and forming a p-electrode on the p-contact layer.

15 Claims, 11 Drawing Sheets

U.S. PATENT DOCUMENTS

2004/0124422 A1 7/2004 Sacamoto et al.
2006/0054907 A1* 3/2006 Lai ............................. 257/96
2006/0081865 A1 4/2006 Sacamoto et al.
2006/0273333 A1* 12/2006 Wu et al. ..................... 257/94
2007/0029541 A1* 2/2007 Xin et al. ..................... 257/14

FOREIGN PATENT DOCUMENTS

JP 2004-221529 A 8/2004

* cited by examiner

OVERGROWTH
40nm

OVERGROWTH
70nm

NITRIDE-BASED SEMICONDUCTOR LIGHT-EMITTING DEVICE AND METHOD OF MANUFACTURING THE SAME

CROSS-REFERENCE TO RELATED PATENT APPLICATION

This application claims the benefit of Korean Patent Application No. 10-2006-0018445, filed on Feb. 24, 2006, in the Korean Intellectual Property Office, the disclosure of which is incorporated herein in its entirety by reference.

BACKGROUND OF THE DISCLOSURE

1. Field of the Disclosure

The present disclosure relates to a semiconductor light-emitting device, and particularly to a nitride-based semiconductor light-emitting device having an improved structure to enhance light extraction efficiency, and a method of manufacturing the same.

2. Description of the Related Art

Light-emitting diodes (LED) are devices used for emitting electrical energy in the form of infrared rays, visible light, or the other light using the characteristics of compound semiconductors. A group III nitride compound semiconductor is a direct transition semiconductor. The group III nitride compound semiconductor is widely utilized in light-emitting devices, such as, LEDs or laser diodes (LDs) because this LED or LD can more stably operate at high temperatures compared to devices which use the other semiconductors. Such a group III nitride compound semiconductor is generally formed on a substrate of sapphire($Al_2O_3$) or SiC. The emission efficiency of the LED depends on the internal quantum efficiency and light extraction efficiency thereof. In order to improve the light-emitting efficiency, a variety of structures of light-emitting diodes that improve light extraction efficiency are under development.

FIGS. 1A and 1B are schematic views showing light paths depending on the structure of an interface between the material layers having different refractive indexes. In FIG. 1A, a first material layer 2 has a flat interface 8a and in FIG. 1B, a first material layer 2 has a rough interface 8b.

Referring to FIG. 1A, when light seeks to pass from the first material layer 2 having a greater refractive index into an air layer 4 having a smaller refractive index (n=1), the light must enter the flat interface 8a at at least a predetermined angle. If the light enters at an angle smaller than the predetermined angle, the light is totally internally reflected at the flat interface 8a and the light extraction efficiency is largely reduced. Therefore, a method of making an interface non-flat has been attempted in order to avoid a reduction of the light extraction efficiency.

Referring to FIG. 1B, by forming the rough interface 8b between the first material layer 2 and the air layer 4, light passing from the first material layer 2 into the air layer 4 maintains an angle equal to or greater than the predetermined incidence angle at the rough interface 8b. As a result, at the rough interface 8b rather than the flat interface 8a, the light extraction efficiency is remarkably increased.

A conventional nitride-based compound semiconductor LED is manufactured by sequentially performing the operations of sequentially forming an n-clad layer, an active layer, and a p-clad layer on a substrate; forming an n-contact surface by etching from a portion of the upper surface of the p-clad layer to a desired depth of the n-clad layer; forming an n-electrode on the n-contact surface; and forming a p-electrode on the p-clad layer. Since the nitride-based compound semiconductor has a reflective index higher than that of an air layer (n=1), for example, has a GaN reflective index n of 2.54, it is difficult in a conventional LED structure for the light generated at the active layer to pass through the flat GaN surface and to be extracted outwardly. Thus the light extraction efficiency of the nitride-based semiconductor LED is not high. In order to resolve this problem, it is proposed that a rough surface is formed on the p-contact layer or the n-contact layer. Japanese Patent Publication No. 2004-221529 discloses a method of forming a rough surface at a surface of a non-electrode region where no p-type and n-type electrode layers are formed. However, in these proposed methods, the rough surface is formed by depositing a metal dot mask on the surface of the p-contact layer and wet etching the p-contact layer, or by dry etching the n-clad layer to form an n-contact layer and wet etching the surface of the n-contact layer, or by performing additional lithography and dry etching on the surface of the non-electrode region. Thus, the above-proposed methods require many additional processes. Also, in order to simultaneously obtain the three structures described above, all of the above processes must be performed, thereby complicating the manufacturing process. Further, in a conventional technique of forming a rough surface, a process for forming a semiconductor light-emitting device is performed and then an additional chemical etching process is performed. Thus, the manufacturing process is complicated and the productivity is low.

SUMMARY OF THE DISCLOSURE

The present invention may provide a nitride-based semiconductor light-emitting device having an improved structure to enhance the light extraction efficiency, and a method of manufacturing the same.

According to an aspect of the present invention, there may be provided a method of manufacturing a nitride-based semiconductor light-emitting device, the method comprising sequentially forming an n-clad layer, an active layer, and a p-clad layer on a substrate; forming a plurality of masking dots on an upper surface of the p-clad layer; forming a p-contact layer having a rough surface on portions of the p-clad layer between the masking dots; forming a rough n-contact surface of the n-clad layer having the same rough shape as the rough shape of the p-contact layer by dry-etching from a portion of the upper surface of the p-contact layer to a desired depth of the n-clad layer; forming an n-electrode on the rough n-contact surface; and forming a p-electrode on the p-contact layer.

According to another aspect of the present invention, there may be provided a nitride-based semiconductor light-emitting device comprising a n-clad layer having a stepped portion formed by etching a predetermined portion of the upper surface of the n-clad layer, wherein the stepped portion has a rough n-contact upper surface; an active layer formed on the upper surface of the n-clad layer; a p-clad layer formed on the active layer; a plurality of masking dots formed on the upper surface of the p-clad layer; a p-contact layer formed on portions of the p-clad layer between the masking dots to have a rough structure; a n-electrode formed on the rough n-contact surface; and a p-electrode formed on the p-contact layer.

The masking dots may be formed of $Si_xN_y$. The masking dots may be formed using a process such as an organic metal chemical vapor deposition process or a molecular beam epitaxy process. More specifically, the masking dots may be formed by supplying a Si vapor source and an N vapor source and chemically reacting the Si vapor source and the N vapor source. The Si vapor source comprises at least one material out of SiH$_4$, Si$_2$H$_6$, ditertiarybutyl silane(DTBSi), and tetraethyl silane(TESi). The N vapor source comprises NH$_3$. Preferably, the p-contact layer may be formed of substantially the same material as a material used to form the p-clad layer. The depth of the rough surface of the p-contact layer is preferably equal to or greater than approximately 10 nm. The p-electrode may comprise at least one of a transparent electrode and a reflective electrode.

According to the present invention, a nitride-based semiconductor light-emitting device having an improved structure to enhance light extraction efficiency can be provided. In particular, according to the present invention, an LED is manufactured by forming the p-contact layer, the n-contact layer and the n-electrode to have rough surfaces without additional lithography and etching processes, thereby maximizing the light extraction efficiency of the LED.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

Figure 1A:
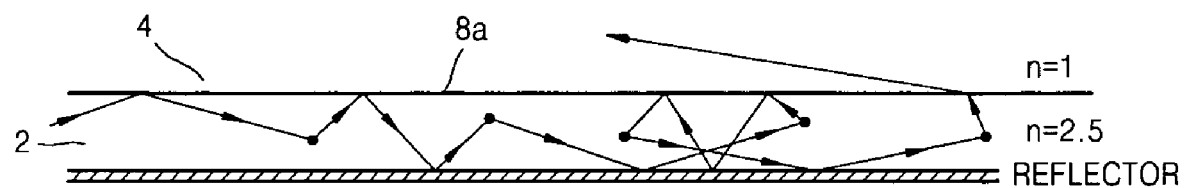
FIG. 1A is a schematic view showing a light path at a flat interface between material layers having different refractive indexes.
Figure 1B:
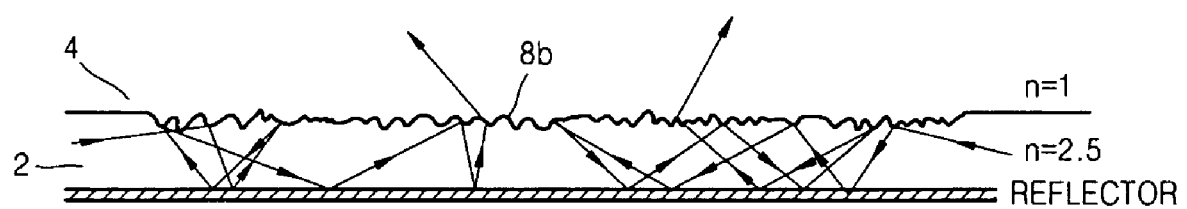
FIG. 1B is a schematic view showing a light path at a rough interface between material layers having different refractive indexes.

The present invention will now be described more fully with reference to the accompanying drawings, in which exemplary embodiments of the invention are shown. In the drawings, the thicknesses of layers and regions are exaggerated for clarity.

Figure 2:
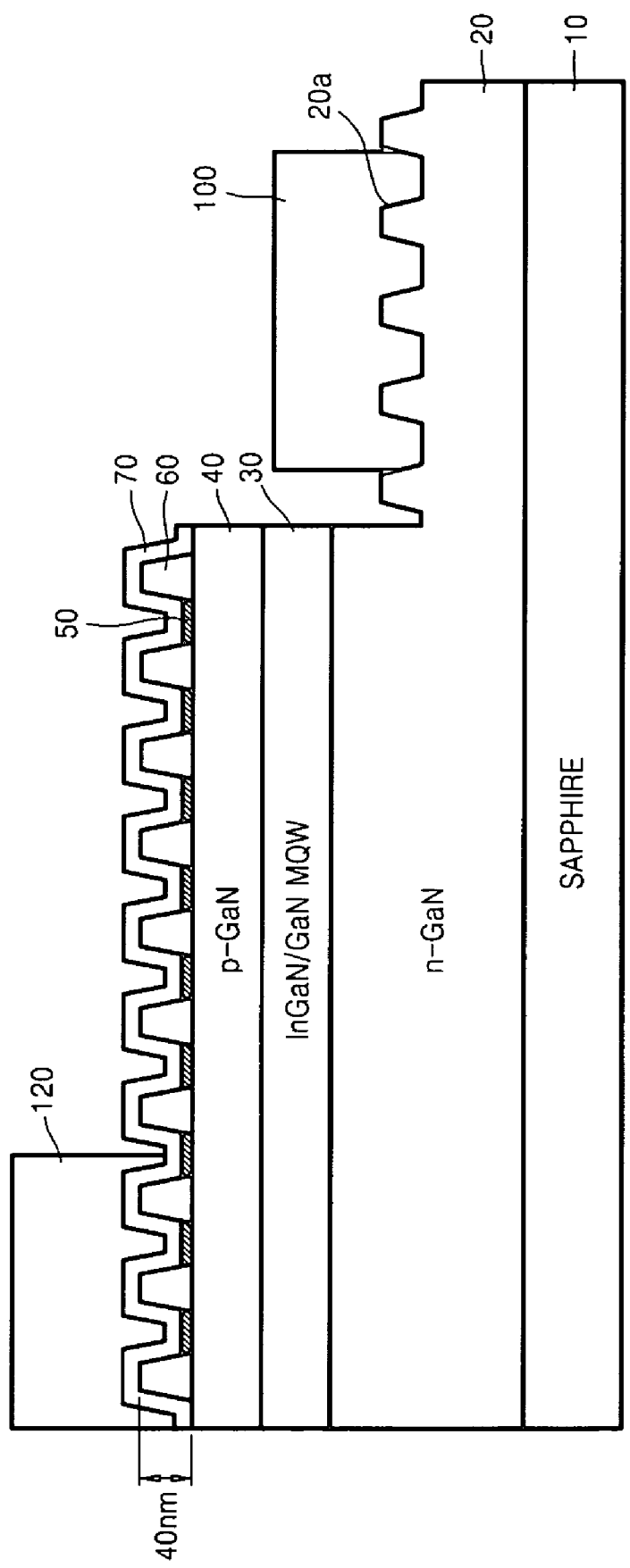
FIG. 2 is an enlarged cross-sectional view of a nitride-based semiconductor light-emitting device according to an embodiment of the present invention.
Figure 3:
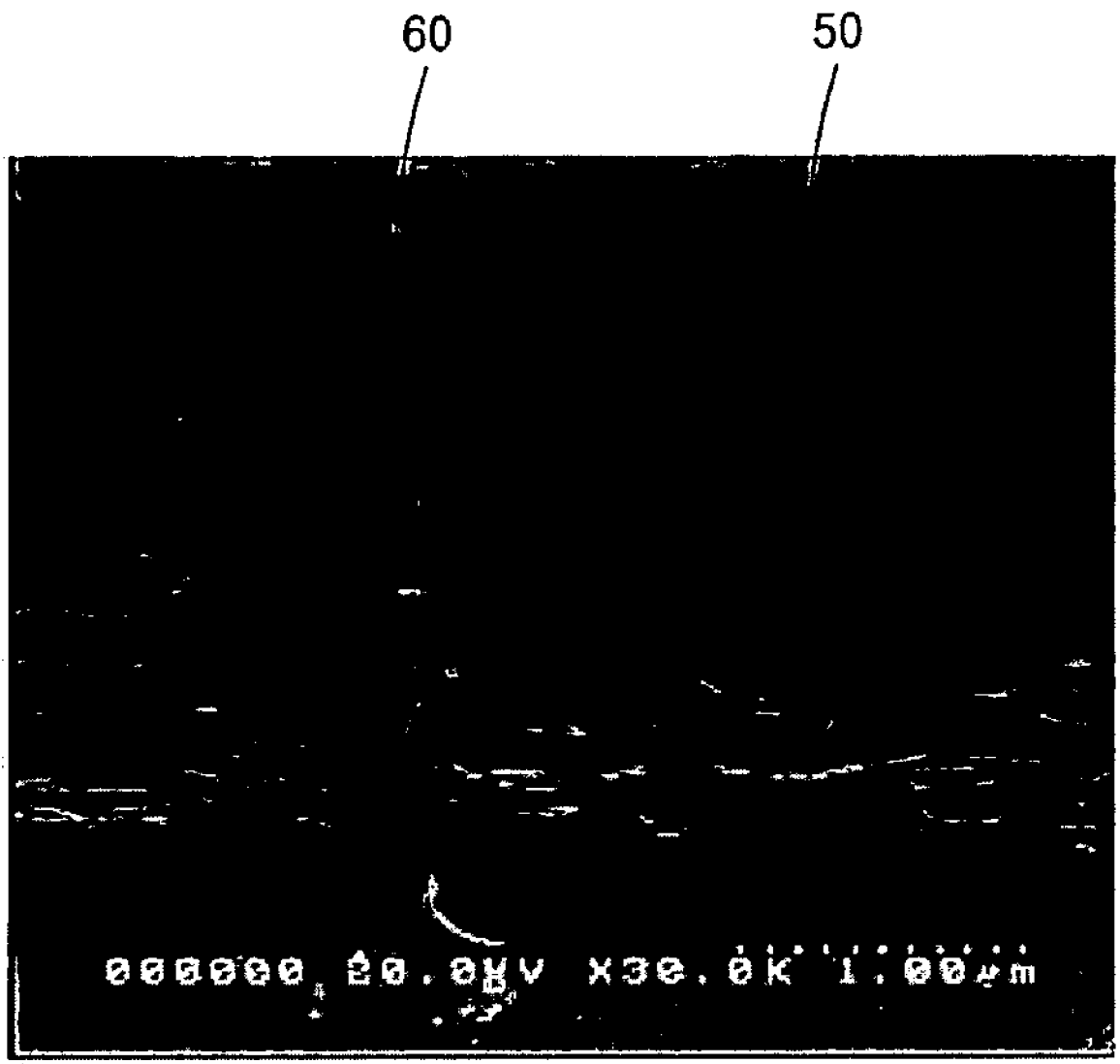
FIG. 3 is a SEM photograph of the upper face of a p-contact layer of the nitride-based semiconductor light-emitting device of FIG. 2.

FIG. 2 is an enlarged cross-sectional view of a nitride-based semiconductor light-emitting device according to an embodiment of the present invention. FIG. 3 is a SEM photograph of the upper face of a p-contact layer of the nitride-based semiconductor light-emitting device of FIG. 2.

Referring to FIG. 2, the nitride-based semiconductor light-emitting device includes an n-clad layer 20, an active layer 30, a p-clad layer 40, a plurality of masking dots 50, and a p-contact layer 60 that are sequentially stacked on a substrate 10. The p-contact layer 60 is formed on the p-clad layer 40 between the masking dots 50 and has a rough structure. Also, an n-electrode 100 and a p-electrode 120 are formed on an etched surface 20a of the n-clad layer 20 and the p-contact layer 60, respectively. Here, as the etched surface 20a of the n-clad layer 20 is an n-rough contact surface 20a, a large amount of light among the light generated in the active layer 30 and traveling to the n-electrode 100 can be reflected at the n-rough contact surface 20a. The reflected light returns to the active layer 30 to improve the internal quantum efficiency or is extracted externally to improve the light extraction efficiency of the nitride-based semiconductor light-emitting device.

The plurality of masking dots 50 are required to form the rough p-contact layer 60 on the p-clad layer 40, and can also improve the light extraction efficiency by diffracting and/or scattering the light generated in the active layer 30. Here, the masking dots 50 may be formed of SiN. To form a rough structure of the p-contact layer 60 on the p-clad layer 40, the thickness and width of the masking dots 50 can be appropriately adjusted.

It is preferable that the substrate 10 is formed of one of Si, GaAs, SiC, GaN and sapphire. The n-clad layer 20 may be formed of an n-GaN based group III-V nitride semiconductor, preferably, n-GaN or n-GaN/AlGaN. Also, the p-clad layer 40 may be formed of a p-GaN based group III-V nitride semiconductor, preferably p-GaN or p-GaN/AlGaN.

The active layer 30 may be formed of a GaN based group III-V nitride semiconductor which is In$_x$Al$_y$Ga$_{1-x-y}$N ($0 \leq x \leq 1$, $0 \leq y \leq 1$ and $0 \leq x+y \leq 1$), and preferably is formed of InGaN or AlGaN. Here, the active layer 30 may have either a multi-quantum well (MQW) structure or a single quantum well structure. This structure of the active layer 30 does not restrict the technical scope of the present invention. For example, it may be the most preferable that the active layer 30 has a GaN/InGaN/GaN MQW structure or a GaN/AlGaN/GaN MQW structure.

The p-contact layer 60 may be formed of substantially the same material as that of the p-clad layer 40. For example, the p-contact layer 60 may be formed of a p-GaN based group III-V nitride semiconductor, preferably p-GaN or p-GaN/AlGaN. Also, the depth of the rough surface of the p-contact layer 60 may be preferably over approximately 10 nm. Here, as the p-contact layer 60 has a rough surface, the rough surface of the p-contact layer 60 can diffract and/or scatter the light generated in the active layer 30 to thereby improve the light extraction efficiency.

Preferably, the p-electrode 120 further includes at least one of a transparent electrode 70 or a reflective electrode (not shown). The transparent electrode 70 may be formed on the entire surface of the p-contact layer 60 and may be formed of a transparent conductive material, such as Indium Tin Oxide (ITO). It is preferable that the transparent electrode 70 may be formed to correspond to the rough structure of the p-contact layer 60.

In the nitride-based semiconductor light-emitting device of FIG. 2, when a desired voltage is applied between the n-electrode 100 and the p-electrode 120, electrons and holes derived from the n-clad layer 20 and the p-clad layer 40, respectively, are injected to the active layer 30 and are combined in the active layer 30 so that light can be emitted from the active layer 30.

According to the present embodiment of the present invention, a light emitting surface of the nitride-based semiconductor light-emitting device is rough so as to diffract or/and scatter the light generated in the active layer 30, thus enhancing the light extraction efficiency. Also, the n-contact rough surface 20a is formed at the n-clad layer 20 and the n-electrode 100 is formed on the n-contact surface 20a, so that the light extraction efficiency is increased compared to the conventional technology. Therefore, the light extraction efficiency of the nitride-based semiconductor light-emitting device according to the present embodiment of the present invention may be improved compared to the conventional technology.

Figure 4A:
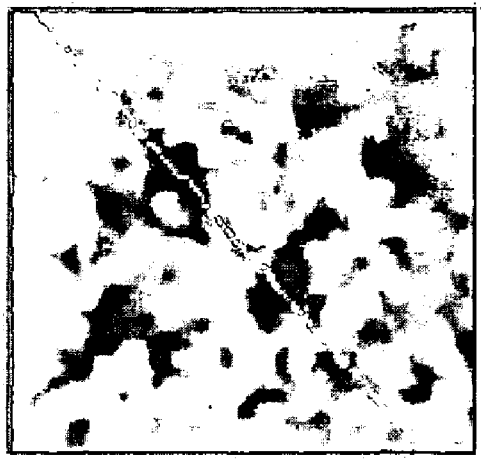
FIGS. 4A and 4B are AFM photographs of a p-contact layer of the nitride-based semiconductor light-emitting device of FIG. 2 when having rough surfaces stepped by 40 nm and 70 nm, respectively.
Figure 4B:
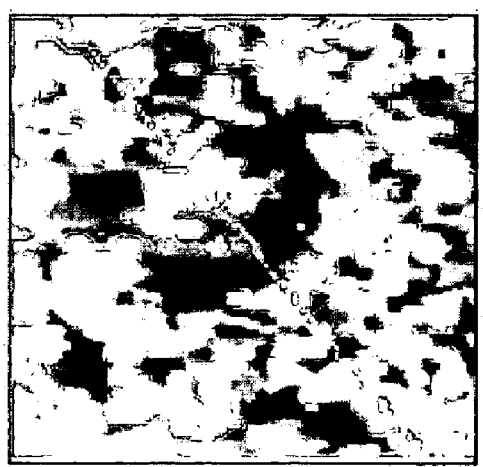
Figure 5:
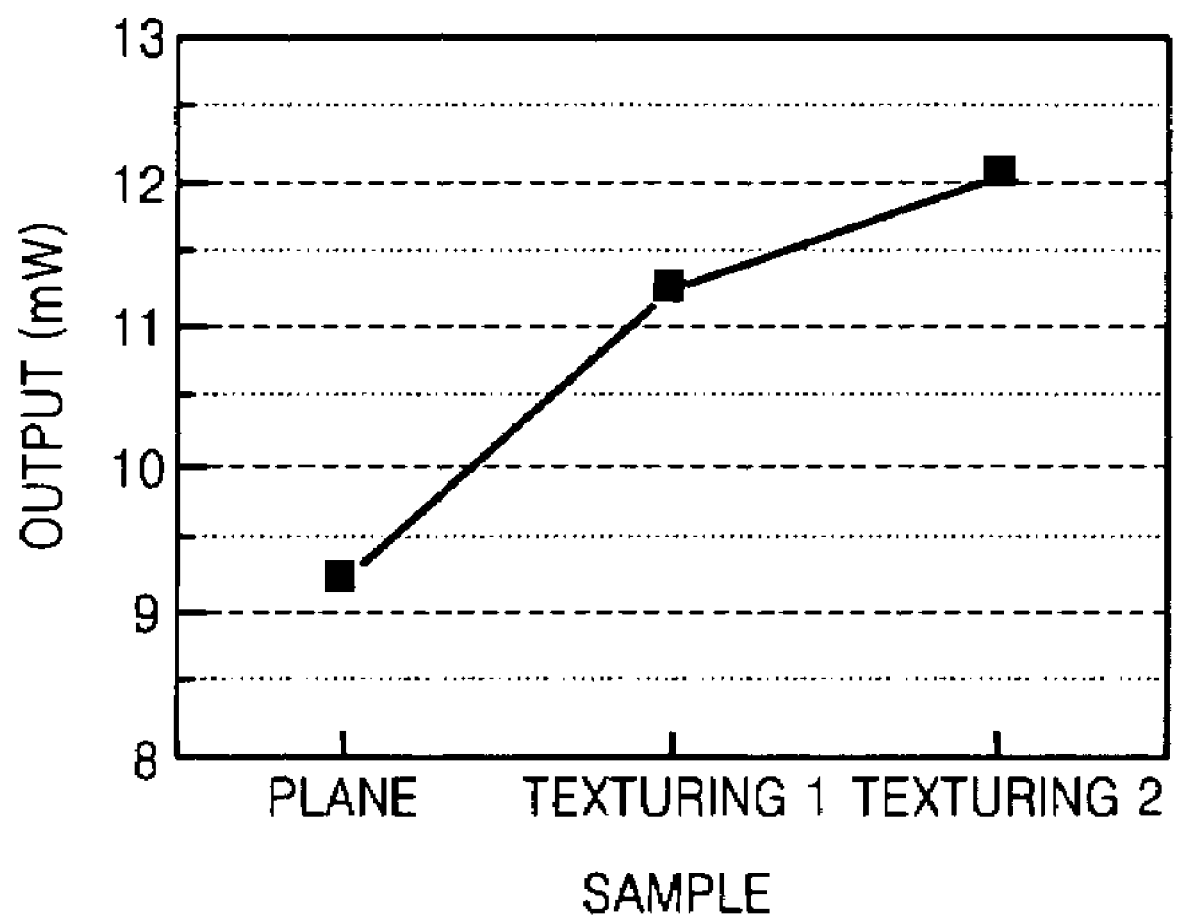
FIG. 5 is a graph indicating the light output characteristics of nitride-based semiconductor light-emitting device samples including the p-contact layers having rough surfaces stepped by 40 nm and 70 nm respectively shown in FIGS. 4A and 4B.

FIGS. 4A and 4B are AFM photographs of the p-contact layer 60 of the nitride-based semiconductor light-emitting device of FIG. 2 when having rough surfaces with depths of 40 nm and 70 nm, respectively. FIG. 5 is a graph indicating the light output characteristics of nitride-based semiconductor light-emitting device samples including the p-contact layers having rough surfaces stepped by 40 nm and 70 nm respectively shown in FIGS. 4A and 4B. Here, a plane sample is a conventional flat-surfaced LED having a sapphire/n-GaN/MQW/p-GaN structure, and a texturing 1 sample and a texturing 2 sample are nitride-based semiconductor light-emitting devices including p-contact layers having rough surfaces with depths of 40 nm and 70 nm, respectively.

FIGS. 6A through 6F are views illustrating a process of manufacturing the nitride-based semiconductor light-emitting device of FIG. 2, according to an embodiment of the present invention. Using this method, the nitride-based semiconductor light-emitting device can be manufactured by forming the p-contact layer 60, the n-contact surface 20a and the n-electrode 100 to have rough surfaces without need to add lithographic and etching processes to a conventional LED manufacturing method, so that light extraction efficiency is maximized.

Figure 6A:
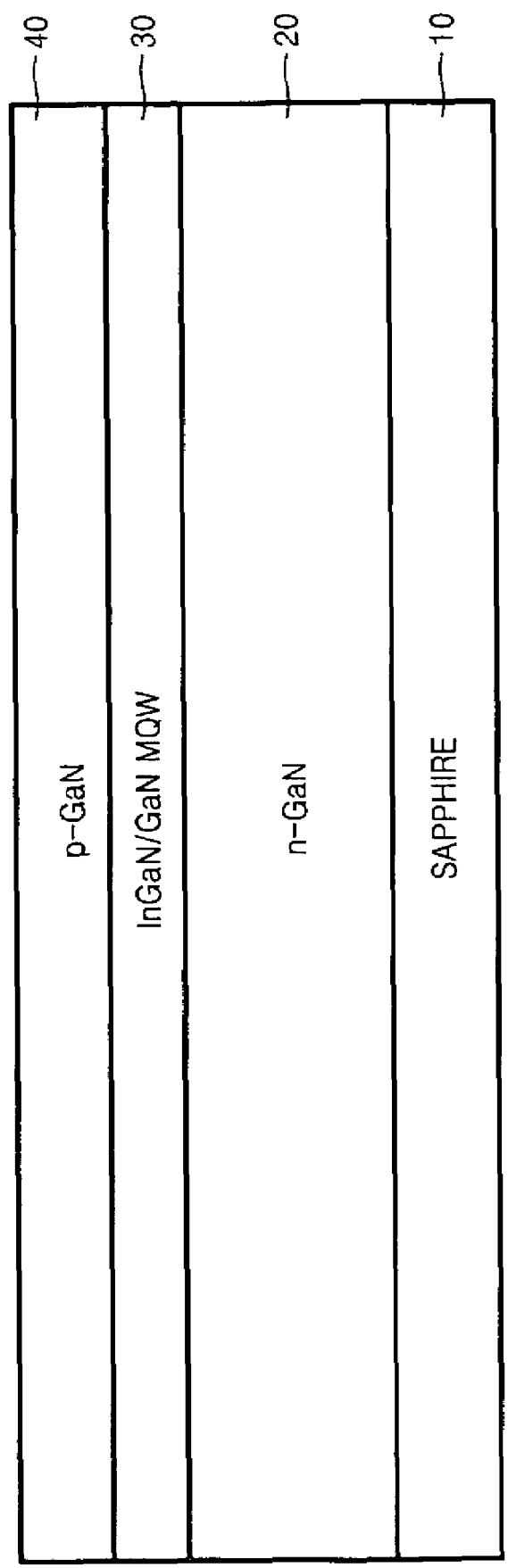
FIGS. 6A through 6F illustrate a process of manufacturing the nitride-based semiconductor light-emitting device of FIG. 2, according to an embodiment of the present invention.

Referring to FIG. 6A, the n-clad layer 20 is formed by stacking the same material layer (e.g., growing a GaN-based crystalline layer on a GaN substrate) or a different material layer (e.g., growing a GaN-based crystalline layer on a sapphire substrate) on the substrate 10. The substrate 10 may be formed of Si, GaAs, SiC, GaN, or sapphire. The n-clad layer 20 may be formed of a n-GaN based group III-V nitride-based semiconductor, and preferably may be formed of n-GaN or n-GaN/AlGaN.

Thereafter, the active layer 30 and the p-clad layer 40 are successively formed on the n-clad layer 20. The active layer 30 may be formed of a GaN-based group III-V nitride semiconductor which is $In_xAl_yGa_{1-x-y}N$ ($0 \leq x \leq 1$, $0 \leq y \leq 1$ and $0 \leq x+y \leq 1$), and preferably may be formed of InGaN or AlGaN. Here, the active layer 30 may have either a multi-quantum well (MQW) structure or a single quantum well structure. This structure of the active layer 30 does not restrict the technical scope of the present invention. Preferably, the active layer 30 may have either a GaN/InGaN/GaN MQW structure or a GaN/AlGaN/GaN MQW structure.

Also, the p-clad layer 40 may be formed of a p-GaN based group III-V nitride semiconductor, and preferably may be formed of p-GaN or p-GaN/AlGaN.

The n-clad layer 20, the active layer 30, and the p-clad layer 40 may be each formed by vapor deposition such as Halide or Hydride vapor phase epitaxy (HVPE), Metal Organic Chemical Vapor Deposition (MOCVD), or Molecular Beam Epitaxy (MBE). These vapor deposition methods are well known, so a detailed explanation thereof is omitted.

Figure 6B:
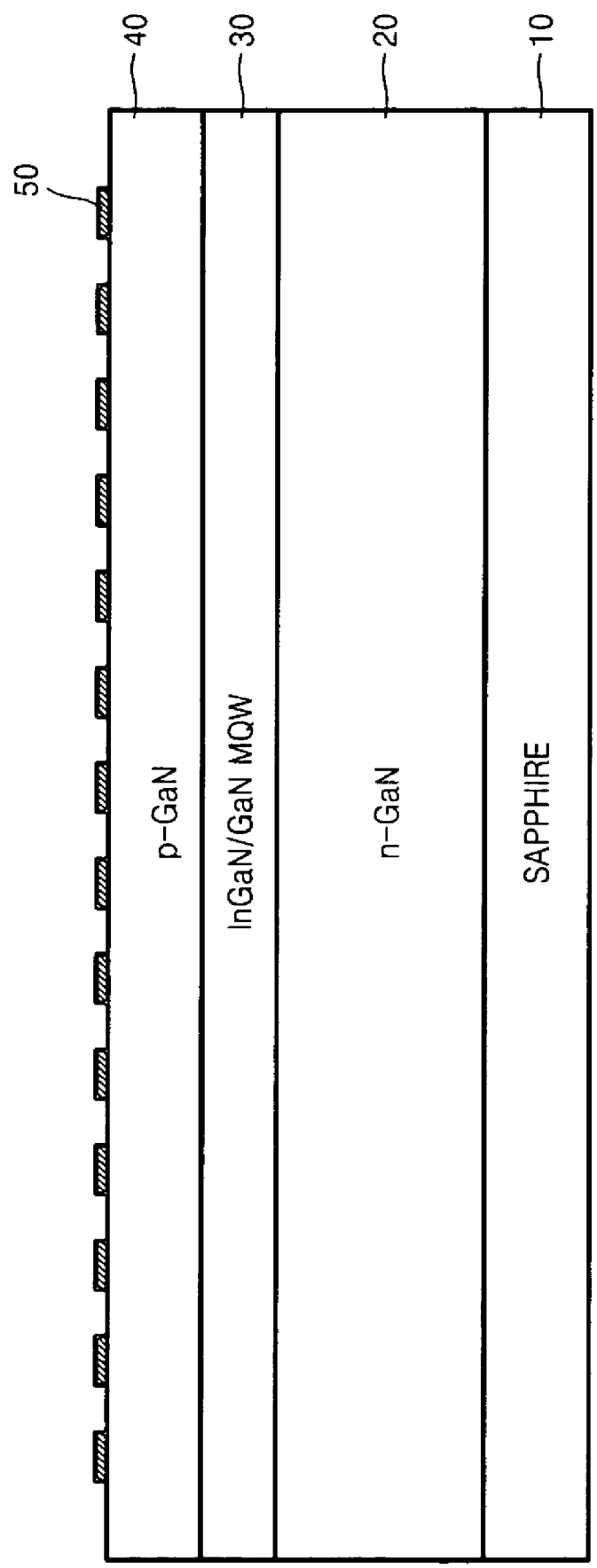
Figure 6C:
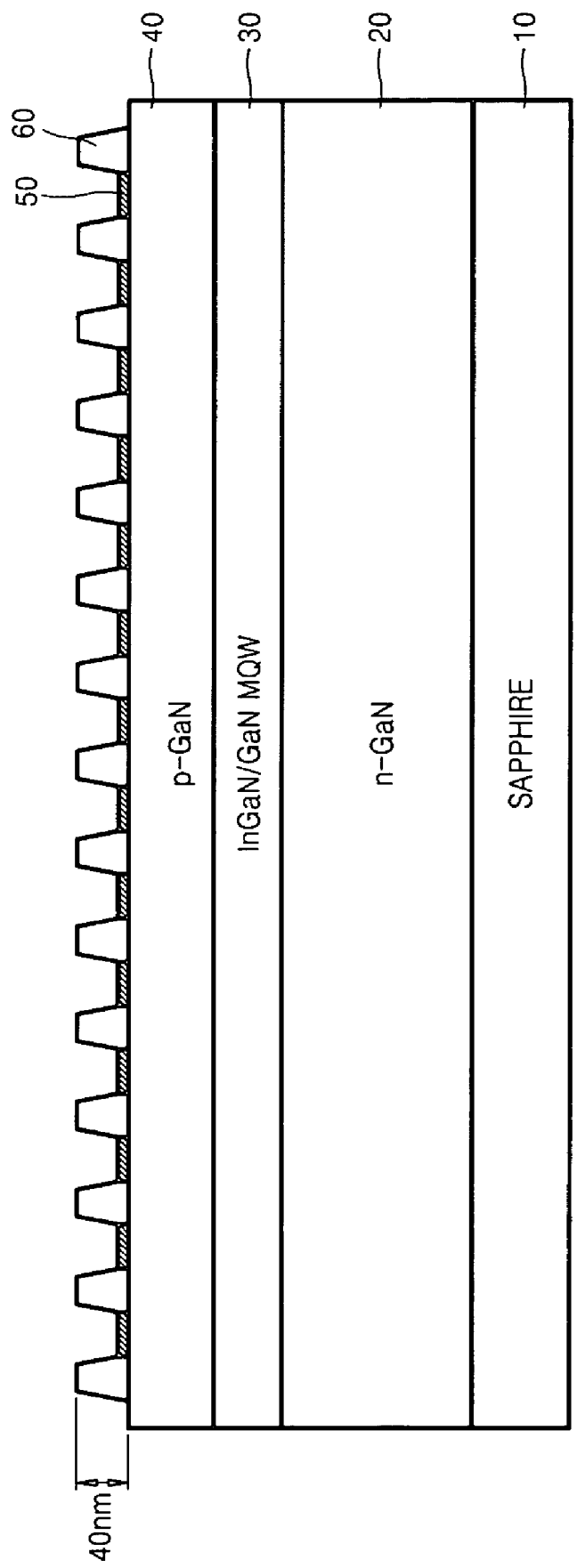

Referring to FIGS. 6B and 6C, the plurality of masking dots 50 are formed on the upper surface of the p-clad layer 40.

The masking dots 50 may be formed of $Si_xN_y$, and may be formed using an organic metal chemical vapor deposition process or a molecular beam epitaxy process. More specifically, the masking dots 50 are formed by supplying a Si vapor source and an N vapor source to the upper surface of the p-clad layer 40 and chemically reacting the Si vapor and the N vapor. Here, the Si vapor source includes at least one of $SiH_4$, $Si_2H_6$, ditertiarybutyl silane (DTBSi), and tetraethyl silane (TESi), and the N vapor source includes $NH_3$. The masking dots 50 may be formed in a thickness of several nm to several hundred nm.

Thereafter, the p-contact layer 60 having a rough structure is formed on the p-clad layer 40 in between the masking dots 50. As the masking dots 50 are formed of a nitride such as $Si_xN_y$, no group III-V nitride semiconductors are epitaxially grown on the masking dots 50. Using this characteristic of a nitride, the p-contact layer 60 having a rough structure may be formed.

The p-contact layer 60 may preferably be formed of substantially the same material as that of the p-clad layer 40. For example, the p-contact layer 60 may be formed of p-GaN based group III-V nitride semiconductor and preferably may be formed of p-GaN or p-GaN/AlGaN. Also, the depth of the rough surface of the p-contact layer 60 may be preferably no less than approximately 10 nm. The p-contact layer 60 may be formed by vapor deposition, such as organic metal chemical vapor deposition or molecular beam epitaxy.

Figure 6D:
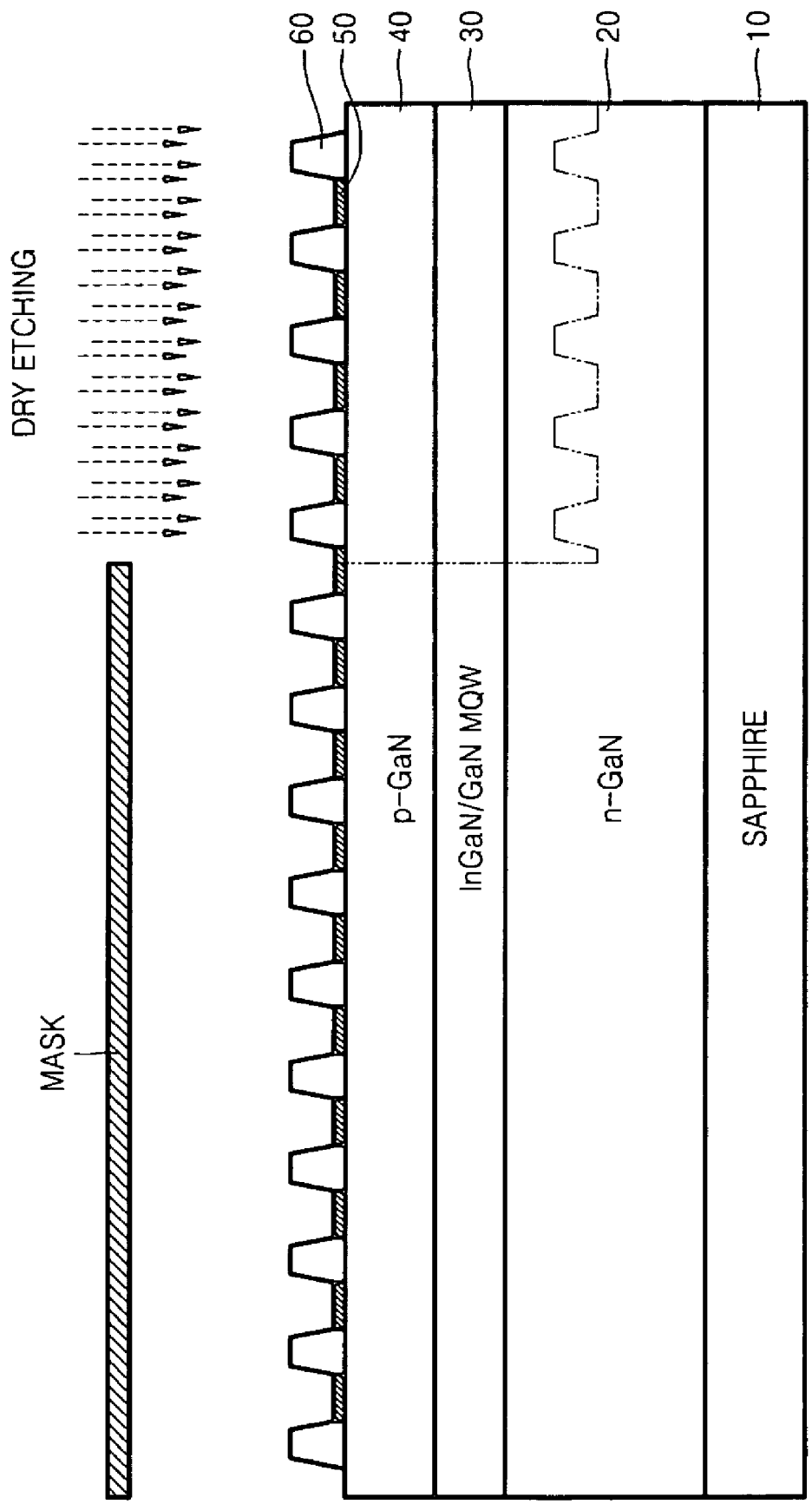

Referring to FIG. 6D, the n-contact rough surface 20a (not shown in 6D) is formed on the n-clad layer 20 by dry etching from a portion of the upper surface of p-contact layer 60 to a desired depth of the n-clad layer 20 and by transferring the rough shape of the p-contact layer 60 to the n-clad layer 20. Preferably, the n-clad layer 20 may be dry etched using a plasma etching process.

Figure 6E:
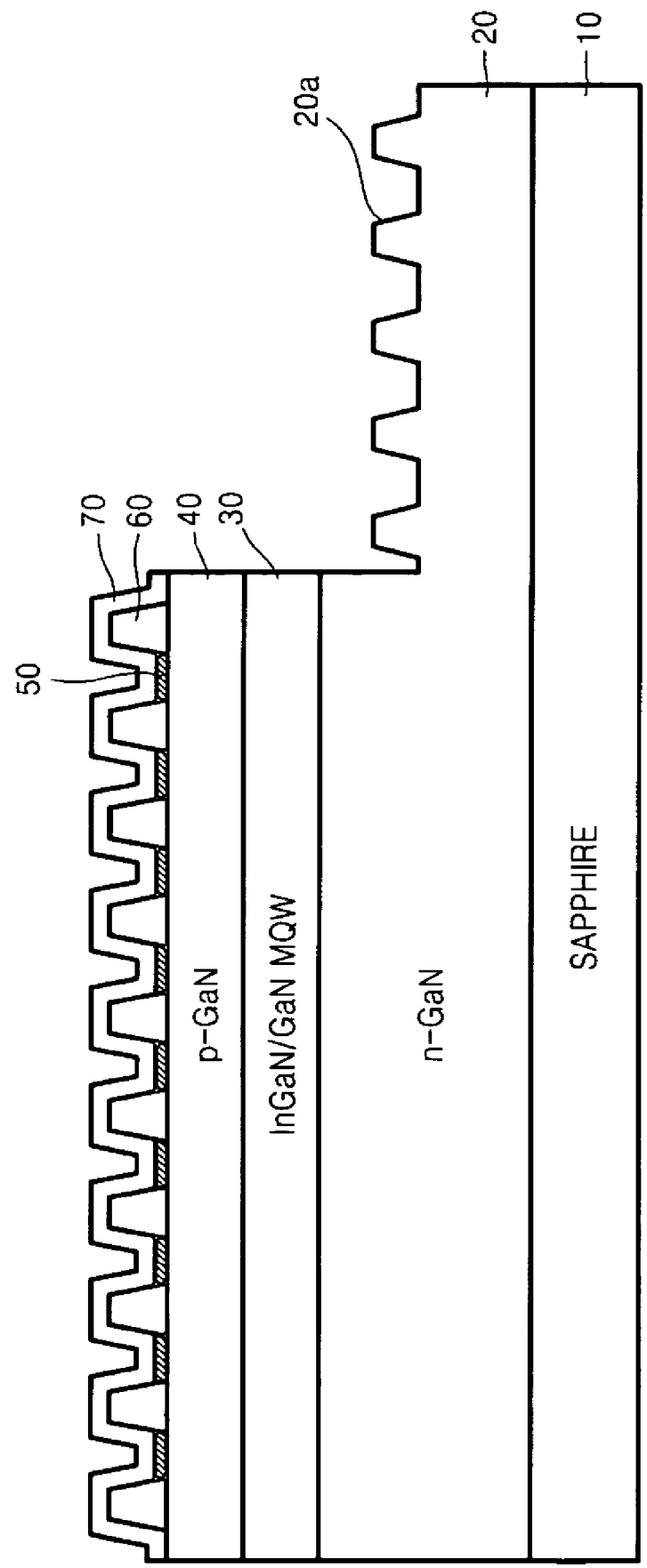
Figure 6F:
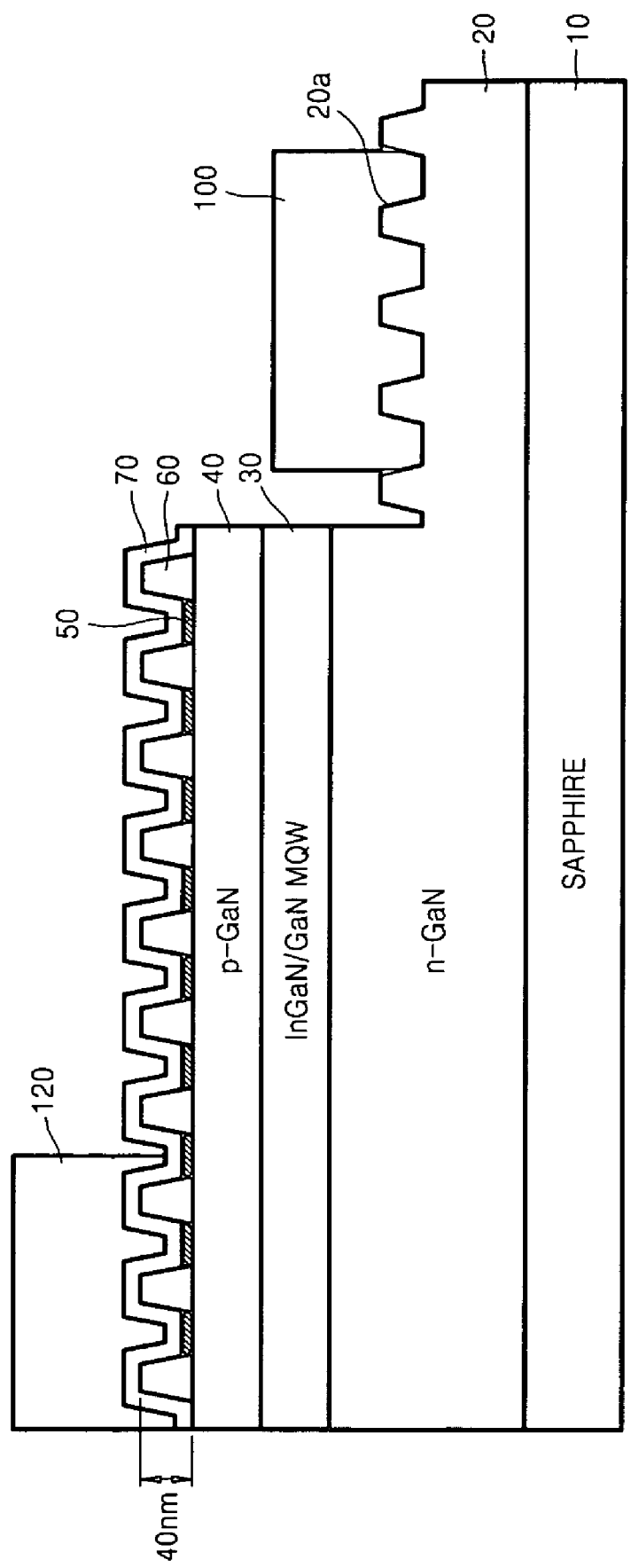

Referring to FIG. 6E and 6F, on the n-contact rough surface 20a and the p-contact layer 60, the n-electrode 100 and the p-electrode 120 are formed respectively. Preferably, the p-electrode 120 may further include at least one of the transparent electrode 70 and the reflective electrode (not shown). The transparent electrode 70 may be formed of a transparent conductive material, such as Indium Tin Oxide (ITO), by vapor deposition such as organic metal chemical vapor deposition or molecular beam epitaxy. It is preferable that the transparent electrode 70 may be formed on the entire surface of the p-contact layer 60. Also, It is preferable that the transparent electrode 70 may be formed corresponding to the rough pattern of the p-contact layer 60.

The n-electrode 100 and the p-electrode 120 may be formed of metal, such as Al, Ag, Au, Pd, etc. In particular, the n-electrode 100 may be formed of a material having good reflectivity characteristics, such as, Ag. Using the process described above, the nitride-based semiconductor light-emitting device of the present invention can be manufactured.

According to the present invention, a nitride-based semiconductor light-emitting device having an improved structure to enhance light extraction efficiency can be provided. The light-emitting surface of the nitride-based semiconductor light-emitting device has a rough structure so as to diffract and/or scatter the light generated in an active layer to thereby increase the light extraction efficiency. Also, a rough n-contact surface is formed at an n-clad layer, and an n-electrode is formed on the rough n-contact surface, thus enhancing the light extraction efficiency compared to the conventional technology. Therefore, the light extraction efficiency of the nitride-based semiconductor light-emitting device of the present invention is improved compared to the conventional technology.

In particular, according to the present invention, an LED is manufactured by forming the p-contact layer, the n-contact layer and the n-electrode to have rough surfaces without additional lithography and etching processes, thereby maximizing the light extraction efficiency of the LED.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a nitride-based semiconductor light-emitting device, comprising:
    sequentially forming an n-clad layer, an active layer, and a p-clad layer on a substrate;
    forming a plurality of masking dots on an upper surface of the p-clad layer;
    forming a p-contact layer having a rough surface on portions of the p-clad layer between the masking dots;
    forming a rough n-contact surface of the n-clad layer having the same rough shape as the rough shape of the p-contact layer by dry-etching from a portion of the upper surface of the p-contact layer to a desired depth of the n-clad layer;
    forming an n-electrode on the rough n-contact surface; and
    forming a p-electrode on the p-contact layer.

2. The method of claim 1, wherein the masking dots are formed of $Si_xN_y$.

3. The method of claim 2, wherein the masking dots are formed using organic metal chemical vapor deposition process or a molecular beam epitaxy process.

4. The method of claim 3, wherein the masking dots may be formed by supplying a Si vapor source and an N vapor source and chemically reacting the Si vapor source and the N vapor source.

5. The method of claim 4, wherein the Si vapor source comprises at least one material out of $SiH_4$, $Si_2H_6$, ditertiarybutyl silane(DTBSi), and tetraethyl silane(TESi).

6. The method of claim 4, wherein the N vapor source comprises $NH_3$.

7. The method of claim 1, wherein the p-contact layer is formed of substantially the same material as a material used to form the p-clad layer.

8. The method of claim 1, wherein the depth of the rough surface of the p-contact layer is equal to or greater than approximately 10 nm.

9. The method of claim 1, wherein the p-electrode comprises at least one of a transparent electrode and a reflective electrode.

10. A nitride-based semiconductor light-emitting device manufactured using the method of claim 1.

11. A nitride-based semiconductor light-emitting device comprising
    a n-clad layer having a stepped portion formed by etching a predetermined portion of the upper surface of the n-clad layer, wherein the stepped portion has a rough n-contact upper surface;
    an active layer formed on the upper surface of the n-clad layer;
    a p-clad layer formed on the active layer;
    a plurality of masking dots formed on the upper surface of the p-clad layer;
    a p-contact layer formed on portions of the p-clad layer between the masking dots not to be located on the masking dots, whereby the p-contact layer has a rough structure;
    a n-electrode formed on the rough n-contact surface; and
    a p-electrode formed on the p-contact layer.

12. The nitride-based semiconductor light-emitting device of claim 11, wherein the masking dots are formed of SiN.

13. The nitride-based semiconductor light-emitting device of claim 11, wherein the p-contact layer is formed of substantially the same material as a material used to form the p-clad layer.

14. The nitride-based semiconductor light-emitting device of claim 11, wherein the depth of the rough surface of the p-contact layer is equal to or greater than approximately 10 nm.

15. The nitride-based semiconductor light-emitting device of claim 11, wherein the p-electrode comprises at least one of a transparent electrode and a reflective electrode.

* * * * *